US011624982B2

(12) United States Patent
Hwang et al.

(10) Patent No.: US 11,624,982 B2
(45) Date of Patent: Apr. 11, 2023

(54) PHOTOSENSITIVE RESIN COMPOSITION AND CURED FILM

(71) Applicant: LG CHEM, LTD., Seoul (KR)

(72) Inventors: Seung Yeon Hwang, Daejeon (KR); Dai Seung Choi, Daejeon (KR); Min Hyung Lee, Daejeon (KR); Dongmin Jeong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 321 days.

(21) Appl. No.: 16/631,985

(22) PCT Filed: Nov. 9, 2018

(86) PCT No.: PCT/KR2018/013648
§ 371 (c)(1),
(2) Date: Jan. 17, 2020

(87) PCT Pub. No.: WO2019/168252
PCT Pub. Date: Sep. 6, 2019

(65) Prior Publication Data
US 2020/0166842 A1    May 28, 2020

(30) Foreign Application Priority Data
Feb. 28, 2018   (KR) ......................... 10-2018-0024819

(51) Int. Cl.
| | | |
|---|---|---|
| *G03F 7/037* | (2006.01) | |
| *G03F 7/038* | (2006.01) | |
| *G03F 7/023* | (2006.01) | |
| *G03F 7/38* | (2006.01) | |
| *G03F 7/40* | (2006.01) | |
| *G03F 7/039* | (2006.01) | |
| G03F 7/16 | (2006.01) | |
| G03F 7/20 | (2006.01) | |
| G03F 7/32 | (2006.01) | |

(52) U.S. Cl.
CPC .......... *G03F 7/0388* (2013.01); *G03F 7/0233* (2013.01); *G03F 7/039* (2013.01); *G03F 7/0387* (2013.01); *G03F 7/162* (2013.01); G03F 7/20 (2013.01); G03F 7/322 (2013.01); G03F 7/38 (2013.01); G03F 7/40 (2013.01)

(58) Field of Classification Search
CPC .......... G03F 7/087; G03F 7/0392; G03F 7/38; G03F 7/40; G03F 7/037; G03F 7/0387; G03F 7/0388; G03F 7/0233
See application file for complete search history.

(56) References Cited

U.S. PATENT DOCUMENTS 5,025,088 A * 6/1991 Maeda .................. G03F 7/0757
430/283.1
5,071,948 A * 12/1991 Khanna .................. C08G 73/22
528/331
2008/0233513 A1 * 9/2008 Komatsu ........... H01L 21/02118
430/322
2009/0202793 A1 8/2009 Tanaka et al.
2011/0212402 A1 9/2011 Chou et al.
2013/0108963 A1 * 5/2013 Tanaka ...................... C08F 2/20
430/283.1
2015/0160553 A1 * 6/2015 Kwon ................... G03F 7/0233
430/283.1
2015/0168835 A1 * 6/2015 Lee ....................... G03F 7/0048
430/270.1
2015/0301453 A1 * 10/2015 Komori ................. G03F 7/0046
430/283.1
2016/0083512 A1 3/2016 Kamada et al.
2017/0017154 A1 1/2017 Mukaiyama et al.
2017/0168391 A1 6/2017 Yoshida et al.
2017/0298186 A1 10/2017 Takemura et al.
2018/0031970 A1 2/2018 Arimoto et al.
2018/0186936 A1 7/2018 Ju et al.
2018/0371146 A1 12/2018 Chayama et al.
2019/0023846 A1 1/2019 Yun et al.
2019/0033714 A1 1/2019 Baba et al.
2019/0081258 A1 3/2019 Masuda et al.
2019/0256655 A1 8/2019 Masuda et al.

FOREIGN PATENT DOCUMENTS

| | | | | |
|---|---|---|---|---|
| DE | 3724368 A | * | 2/1989 | .......... C08G 18/348 |
| JP | 2002-088154 A | | 3/2002 | |
| JP | 2010-174195 A | | 8/2010 | |
| JP | 2011-180571 A | | 9/2011 | |
| JP | 2014-214295 A | | 11/2014 | |
| JP | 2016-204506 A | | 12/2016 | |
| JP | 2017-193500 A | | 10/2017 | |
| KR | 10-2009-0038390 A | | 4/2009 | |
| KR | 10-1202012 B1 | | 11/2012 | |
| KR | 10-2016-0020229 A | | 2/2016 | |
| KR | 10-2017-0001644 A | | 1/2017 | |
| KR | 10-2017-0011011 A | | 2/2017 | |
| KR | 10-2017-0119643 A | | 10/2017 | |
| KR | 10-2017-0125842 A | | 11/2017 | |
| TW | 201731920 A | | 9/2017 | |
| TW | 201736501 A | | 10/2017 | |
| TW | 201738655 A | | 11/2017 | |
| TW | 201742880 A | | 12/2017 | |
| TW | 201802586 A | | 1/2018 | |
| WO | 2015-152209 A1 | | 10/2015 | |
| WO | 2016-035819 A1 | | 3/2016 | |
| WO | 2016-140024 A1 | | 9/2016 | |
| WO | 2017-064984 A1 | | 4/2017 | |
| WO | 2018-087990 A1 | | 5/2018 | |

OTHER PUBLICATIONS

PCT Search Report & Written Opinion issued for International Application No. PCT/KR2018/013648 dated Mar. 11, 2019, 12 pages.

* cited by examiner

Primary Examiner — John S Chu
(74) Attorney, Agent, or Firm — Rothwell, Figg, Ernst & Manbeck, P.C.

(57) ABSTRACT

A photosensitive resin composition including a polyamide-imide resin having a specific structure, a film comprising a cured product of the photosensitive resin composition, a method for preparing the film and a method for forming a resist pattern using the photosensitive resin composition.

6 Claims, No Drawings

PHOTOSENSITIVE RESIN COMPOSITION AND CURED FILM

CROSS-REFERENCE TO RELATED APPLICATION(S)

This application is a 35 U.S.C. § 371 National Phase Entry Application from PCT/KR2018/013648, filed on Nov. 9, 2018, and designating the United States, which claims the benefits of the filing date of Korean Patent Application No. 10-2018-0024819 filed with the Korean Intellectual Property Office on Feb. 28, 2018, the entire content of which is incorporated herein by reference.

The present invention relates to a photosensitive resin composition and a cured film.

TECHNICAL FIELD

Background Art

The photosensitive resin is a typical functional polymer material that has been practically used in the production of various precision electronic and information industrial products, and is currently used in high-tech industries, especially in the production of semiconductors and displays.

Generally, a photosensitive resin means a polymer compound which undergoes a chemical change in a molecular structure in a short time by light irradiation, causing changes in physical properties such as solubility, coloration, and curing with respect to a specific solvent. The use of the photosensitive resin enables fine precision processing, can greatly reduce energy and raw material use as compared with a thermal reaction process, and work can be quickly and accurately performed in a small installation space, and thus the photosensitive resin is widely used in the field of various precision electronic and information industries such as advanced printing field, semiconductor production, display production, and photocurable surface coating materials.

Meanwhile, recently, as electronic devices have become more highly integrated and formed with a fine pattern, a photosensitive resin capable of minimizing a defect rate and increasing processing efficiency and resolution has been required. Accordingly, a method of using a polyamide acid, a polyamic acid, or the like as a photosensitive resin has been introduced.

However, the polyamide acid is easily hydrolyzed by water or the like in air, so that the preservability and stability are not sufficient. The polyamic acid has low adhesion to a substrate to be applied and has a problem of deteriorating the physical properties of the electronic wiring and the substrate due to application of a high temperature. In addition, for other types of photosensitive resins, chemical resistance, heat resistance, and electrical properties in the finally cured state are not sufficient, or adhesion to a metal substrate is not sufficient, and thus there is a problem that it is peeled off from the substrate during the development or curing process.

In particular, there is a need to develop a photosensitive resin material capable of forming an ultrafine pattern and also preventing thermal damage of a semiconductor device during a heat treatment process for curing the photosensitive resin composition.

The present invention provides a photosensitive resin composition which can be cured with high efficiency even at a relatively low temperature and can provide a cured material having excellent mechanical properties and photosensitivity.

The present invention also provides a cured film formed from the photosensitive resin composition.

The present invention further provides a method for preparing a cured film which can be cured with high efficiency even at a relatively low temperature and can provide a cured material having excellent mechanical properties and photosensitivity.

In the present invention, a positive-type photosensitive resin composition including a polyamide-imide resin containing a repeating unit represented by the following Chemical Formula 1 and a repeating unit represented by the following Chemical Formula 2, and a photoacid generator, are provided.

[Chemical Formula 1]

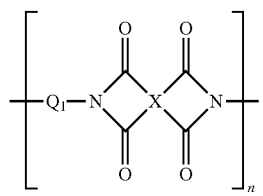

[Chemical Formula 2]

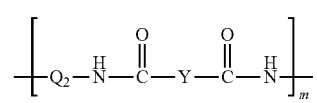

In Chemical Formulas 1 and 2, $Q_1$ and $Q_2$ are each independently an aliphatic, alicyclic, or aromatic divalent functional group, or a divalent organic group containing at least one heteroatom selected from the group consisting of N, O, and S, at least one of $Q_1$ and $Q_2$ includes one or more of a hydroxyl group or a carboxyl group, X is an aliphatic, alicyclic, or aromatic tetravalent organic group, or a tetravalent organic group containing at least one heteroatom selected from the group consisting of N, O, and S, Y is an aliphatic, alicyclic, or aromatic divalent organic group, or a divalent organic group containing at least one heteroatom selected from the group consisting of N, O, and S, and n and m are each an integer of 1 or more.

In addition, in the present invention, a negative-type photosensitive resin composition including a polyamide-imide resin containing a repeating unit represented by the following Chemical Formula 11 and a repeating unit represented by the following Chemical Formula 12, and a photoacid generator, are provided.

[Chemical Formula 11]

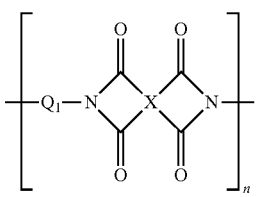

[Chemical Formula 12]

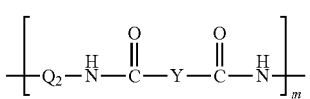

In Chemical Formulas 11 and 12, $Q_1$ and $Q_2$ are each independently an aliphatic, alicyclic, or aromatic divalent functional group, or a divalent organic group containing at least one heteroatom selected from the group consisting of N, O, and S, at least one of the $Q_1$ and $Q_2$ includes one or more of a hydroxyl group or a carboxyl group, and at least one of $Q_1$ and $Q_2$ is substituted with a functional group containing a (meth)acryloyloxy group and an alkylene group having 1 to 20 carbon atoms, or a functional group containing a (meth)acrylate group and an alkylene glycol group having 1 to 20 carbon atoms, X is an aliphatic, alicyclic, or aromatic tetravalent organic group, or a tetravalent organic group containing at least one heteroatom selected from the group consisting of N, O, and S, Y is an aliphatic, alicyclic, or aromatic divalent organic group, or a divalent organic group containing at least one heteroatom selected from the group consisting of N, O, and S, and n and m are each an integer of 1 or more.

Further, in the present invention, a cured film including a cured product of the photosensitive resin composition can be provided.

Further, in the present invention, a method for preparing a cured film including a step of curing the photosensitive resin composition at a temperature of 250° C. or less can be provided.

Further, in the present invention, a method for forming a resist pattern can be provided, including the steps of: forming a resist film on a substrate using the photosensitive resin composition; irradiating the resist film in a pattern using a high energy ray; and developing the resist film using an alkali developing solution.

Hereinafter, a photosensitive resin composition, a cured film, a method for preparing a cured film, and a method for forming a resist pattern according to specific embodiments of the invention will be described in more detail.

Unless otherwise stated, the technical terms used herein are for the purpose of describing particular embodiments only, and are not intended to limit the scope of the invention.

Further, the singular forms "a," "an," and "the" are intended to include plural forms, unless the context clearly indicates otherwise.

In addition, the meaning of the terms "comprise" and "include" as used herein is intended to specify the presence of specific features, ranges, integers, steps, operations, elements, and/or components, but does not preclude the presence or addition of other specific features, ranges, integers, steps, operations, elements, components, and/or groups.

In the present invention, weight average molecular weight means a weight average molecular weight in terms of polystyrene measured by a GPC method. In the process of determining the weight average molecular weight in terms of polystyrene measured by the GPC method, a commonly known analyzing device, a detector such as a refractive index detector, and an analytical column can be used. Commonly applied conditions for temperature, solvent, and flow rate can be used. Specific examples of the measurement conditions are as follows: a Waters PL-GPC220 instrument is used, Polymer Laboratories PLgel MIX-B, 300 mm column, is used at an evaluation temperature of 160° C., 1,2,4-trichlorobenzene is used as a solvent, the flow rate is 1 mL/min, a sample is prepared at a concentration of 10 mg/10 mL and then fed in an amount of 200 µL, and the value of Mw can be determined using calibration curves formed from a polystyrene standard. The molecular weight of the polystyrene standards is nine kinds of 2000/10,000/30,000/70,000/200,000/700,000/2,000,000/4,000,000/10,000,000.

According to one example of the invention, a positive-type photosensitive resin composition including a polyamide-imide resin containing a repeating unit represented by the following Chemical Formula 1 and a repeating unit represented by the following Chemical Formula 2, and a photoacid generator, can be provided.

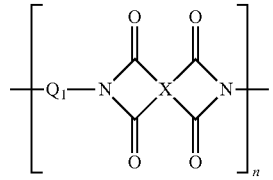

[Chemical Formula 1]

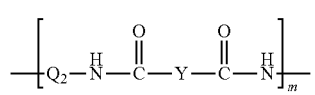

[Chemical Formula 2]

In Chemical Formulas 1 and 2, $Q_1$ and $Q_2$ are each independently an aliphatic, alicyclic, or aromatic divalent functional group, or a divalent organic group containing at least one heteroatom selected from the group consisting of N, O, and S, at least one of $Q_1$ and $Q_2$ includes one or more of a hydroxyl group or a carboxyl group, X is an aliphatic, alicyclic, or aromatic tetravalent organic group, or a tetravalent organic group containing at least one heteroatom selected from the group consisting of N, O, and S, Y is an aliphatic, alicyclic, or aromatic divalent organic group, or a divalent organic group containing at least one heteroatom selected from the group consisting of N, O, and S, and n and m are each an integer of 1 or more.

As a result of continuing studies, the present inventors found through experiments that the photosensitive resin composition including the polyamide-imide resin containing the repeating unit of Chemical Formula 1 and the repeating unit of Chemical Formula 2 can be cured with high efficiency even at a relatively low temperature, and can provide a cured material having excellent mechanical properties and photosensitivity, thereby completing the present invention.

Specifically, the polyamide-imide resin has an imide bond in which at least 90% of the cyclization reaction has been completed, and at the same time, has a carboxyl group or a hydroxyl group. Generally, it is known that if there is an imide bond, the solubility decreases and it is hardly soluble in most organic solvents. On the contrary, when a carboxyl group or a hydroxyl group is introduced into a polyamide-imide resin having a structure that is easily soluble in a polar solvent, photosensitivity can be realized through the introduction of a photo-polymerizable group into a carboxy group or a hydroxyl group, or through the reaction of a carboxylic group or a hydroxyl group with a photoacid generator. In addition, unlike PAA or PAE precursor resins that require high curing temperatures of 300° C. or more in order to form an imide bond, high process temperatures are not required. The temperature of the curing process for forming the cured product is characterized by being able to be applied at a low temperature of 250° C. or less.

The polyamide-imide resin has a weight average molecular weight of 3000 g/mol to 500,000 g/mol, 5000 g/mol to 300,000 g/mol, or 7000 g/mol to 150,000 g/mol which is preferable for forming a cured film having excellent mechanical properties.

Chemical Formulas 1 and 2 are the same as those described above. However, more specific examples of Chemical Formulas 1 and 2 are as follows.

$Q_1$ and $Q_2$ may each have a divalent functional group represented by the following Chemical Formula 3.

[Chemical Formula 3]

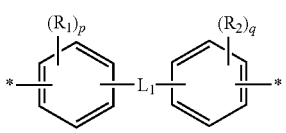

In Chemical Formula 3, $L_1$ is a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O—, or —OCO(CH$_2$)$_{n3}$OCO—, n1, n2, and n3 are each an integer of 1 to 10, $R_1$ and $R_2$ may be the same as or different from each other, and are hydrogen, a halogen, an alkyl group having 1 to 10 carbon atoms, a hydroxyl group, or a carboxyl group, p and q each are numbers in which $R_1$ and $R_2$ are substituted in the aromatic ring and are an integer of 1 to 4, and at least one of $R_1$ and $R_2$ substituted in the aromatic ring is a hydroxyl group or a carboxyl group.

Meanwhile, X may include a tetravalent group represented by the following Chemical Formula 4.

[Chemical Formula 4]

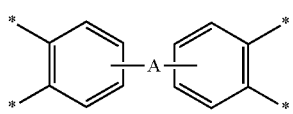

In Chemical Formula 4, A is a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are each an integer of 1 to 10.

As described above, the photosensitive resin composition of the embodiment may include a photoacid generator.

Meanwhile, the positive-type photoresist composition according to one embodiment of the present invention may include a photoacid generator. As the photoacid generator, an onium salt such as iodonium salt, sulfonium salt, diazonium salt, ammonium salt, pyridinium salt, and the like, a halogen-containing compound such as a haloalkyl group-containing hydrocarbon compound, a haloalkyl group-containing heterocyclic compound, and the like (e.g., a halomethyl triazine derivative, and the like), a diazoketone compound such as a 1,3-diketo-2-diazo compound, a diazobenzoquinone compound, a diazonaphthoquinone compound (e.g., a diazonaphthoquinone ester compound, and the like), a sulfone compound such as β-ketosulfone, β-sulfonylsulfone, and the like, a sulfonic acid compound such as alkyl sulfonate, haloalkyl sulfonate, aryl sulfonate, imino sulfonate, and the like, a naphthalimide compound such as N-(trifluoronethylsulfonyloxy)-1,8-naphalinmide, N-(p-toluenesulfonyloxy)-1,8-naphthalimide, N-(methylsulfonyloxy)-1,8-naphthalirnide, N-(camphorsulfonyloxy)-1,8-naphthalimide, and the like may be illustrated. These can be used singly or as a mixture of two or more kinds thereof.

Specifically, the photoacid generator may be, for example, one or more selected from the group consisting of triarylsulfonium salts, diaryliodonium salts, sulfonate compounds, triphenylsulfonium triflate, triphenylsulfonium antimonate, diphenyliodonium triflate, diphenyliodonium antimonate, methoxydiphenyliodonium triflate, di-t-butyliodonium triflate, 2,6-dinitrobenzyl sulfonate, pyrogallol tris (alkyl sulfonate), and succinimidyl triflate.

Another example of the photoacid generator may include a quinone diazide compound, a polyhydroxy compound, a polyamino compound, or a polyhydroxy polyamino compound.

Examples of the quinone diazide compound include a quinone diazide compound in which a sulfonic acid of a quinone diazide forms an ester bond with a polyhydroxy compound, a quinone diazide compound in which a sulfonic acid of a quinone diazide forms a sulfonamide bond with a polyhydroxy compound, and a quinone diazide compound in which a sulfonic acid of a quinone diazide forms an ester bond and/or sulfonamide bond with a polyhydroxy compound. By using such a quinone diazide compound, a positive-type photosensitive resin composition having photosensitivity at an i-line such as a mercury lamp (wavelength of 365 nm), an h-line (wavelength of 405 nm), or a g-line (wavelength 436 nm), which is a general ultraviolet ray, can be obtained. Further, all the functional groups of the polyhydroxy compound, the polyamino compound, and the polyhydroxy polyamino compound do not need to be substituted with a quinone diazide, but it is preferable that two or more functional groups within one molecule are substituted with a quinone diazide.

Examples of the polyhydroxy compound include, but are not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylene tris-FR—CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, and HML-TPHAP (all trade names, manufactured by Honshu Chemical Industry Co., Ltd.), BIR—OC, BIP—PC, BIR—PC, BIR-PTBP, BIR—PCHP, BIP—BIOC—F, 4PC, BIR—BIPC—F, TEP-BIP-A, 46DMOC, 46DMOEP, and TM-BIP-A (all trade names, manufactured by Asahi Organic Chemicals Industry Co., Ltd.), 2,6-dimethoxymethyl-4-t-butylphenol, 2,6-dimethoxymethyl-p-cresol, 2,6-diacetoxyrmethyl-p-cresol, naphthol, tetrahydroxybenzophenone, methyl gallate ester, bisphenol A, bisphenol E, methylene bisphenol, and BisP-AP (all trade names, manufactured by Honshu Chemical Industry Co., Ltd.), and a Novolac resin.

Examples of the polyamino compound include, but are not limited to, 1,4-phenylenediamine, 1,3-phenylenediamine, 4,4'-diaminodiphenyl ether, 4,4'-diaminodiphenylmethane, 4,4'-diaminodiphenylsulfone, and 4,4'-diaminodiphenylsulfide.

Examples of the polyhydroxy polyamino compound include, but are not limited to, 2,2-bis(3-amino-4-hydroxyphenyl)hexafluoropropane and 3,3'-dihydroxybenzidine.

The content of the photoacid generator may vary depending on the kind of the compound. For example, in order to exhibit a sufficient photoacid generating effect, the photoacid generator is preferably contained in an amount of 0.1 parts by weight or more based on 100 parts by weight of the polyamide-imide resin. However, when an excess amount of the photoacid generator is applied to the photosensitive resin composition, the stability of the cured film may be lowered by the photoacid generator remaining after the crosslinking reaction. Therefore, it is preferable that the photoacid generator is contained in an amount of 50 parts by weight or less based on 100 parts by weight of the polyamide-imide resin.

Meanwhile, the positive-type photosensitive resin composition may further include an organic solvent. As the solvent, a compound known to enable the formation of the photosensitive resin composition film in the technical field to which the present invention belongs can be applied without particular limitation. As a non-limiting example, the solvent may be one or more compounds selected from the group consisting of esters, ethers, ketones, aromatic hydrocarbons, and sulfoxides.

The ester solvents may include ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, gamma-butyrolactone, epsilon-caprolactone, delta-valerolactone, alkyl oxyacetate (e.g., methyl oxyacetate, ethyl oxyacetate, butyl oxyacetate (e.g., methyl methoxyacetate, ethyl methoxyacetate, butyl methoxyacetate, methyl ethoxyacetate, ethyl ethoxyacetate, etc.)), 3-oxypropionic acid alkyl ester (e.g., methyl 3-oxypropionate, ethyl 3-oxypropionate (e.g., methyl 3-methoxypropionate, ethyl 3-methoxypropionate, methyl 3-ethoxypropionate, ethyl 3-ethoxypropionate, etc.)), 2-oxypropionic acid alkyl ester (e.g., methyl 2-oxypropionate, ethyl 2-oxypropionate, propyl 2-oxypropionate (e.g., methyl 2-methoxypropionate, ethyl 2-methoxypropionate, propyl 2-methoxypropionate, methyl 2-ethoxypropionate, ethyl 2-ethoxypropionate)), methyl 2-oxy-2-methylpropionate and ethyl 2-oxy-2-methylpropionate (e.g., methyl 2-methoxy-2-methylpropionate, ethyl 2-ethoxy-2-methylpropionate, etc.), methyl pyruvate, ethyl pyruvate, propyl pyruvate, methyl acetoacetate, ethyl acetoacetate, methyl 2-oxobutanoate, ethyl 2-oxobutanoate, and the like.

The ether solvent may include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, and the like.

The ketone solvent may be methyl ethyl ketone, cyclohexanone, cyclopentanone, 2-heptanone, 3-heptanone, N-methyl-2-pyrrolidone, and the like.

The aromatic hydrocarbon solvent may be toluene, xylene, anisole, limonene, or the like.

The sulfoxide solvent may be dimethyl sulfoxide or the like.

The solvent is used in an amount of 50 to 500 parts by weight, 100 to 500 parts by weight, 100 to 300 parts by weight, 100 to 250 parts by weight, or 100 to 150 parts by weight, based on 100 parts by weight of the polyamide-imide resin, from the viewpoint of the coatability exhibited by the photosensitive resin composition.

Meanwhile, according to another embodiment of the invention, a negative-type photosensitive resin composition including a polyamide-imide resin containing a repeating unit represented by the following Chemical Formula 11 and a repeating unit represented by the following Chemical Formula 12, and a photoacid generator, can be provided.

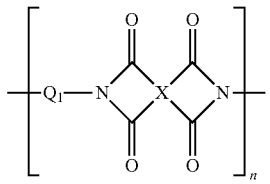

[Chemical Formula 11]

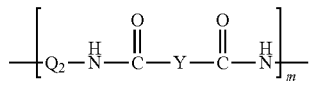

[Chemical Formula 12]

In Chemical Formulas 11 and 12, $Q_1$ and $Q_2$ are each independently an aliphatic, alicyclic, or aromatic divalent functional group, or a divalent organic group containing at least one heteroatom selected from the group consisting of N, O, and S, at least one of $Q_1$ and $Q_2$ includes one or more of a hydroxyl group or a carboxyl group, at least one of $Q_1$ and $Q_2$ is substituted with a functional group containing a (meth)acryloyloxy group and an alkylene group having 1 to 20 carbon atoms or a functional group containing a (meth)acrylate group and an alkylene glycol group having 1 to 20 carbon atoms, X is an aliphatic, alicyclic, or aromatic tetravalent organic group or a tetravalent organic group containing at least one heteroatom selected from the group consisting of N, O, and S, Y is an aliphatic, alicyclic, or aromatic divalent organic group, or a divalent organic group containing at least one heteroatom selected from the group consisting of N, O, and S, and n and m are each an integer of 1 or more.

As a result of continuing studies, the present inventors found through experiments that the photosensitive resin composition including the polyamide-imide resin containing the repeating unit of Chemical Formula 11 and the repeating unit of Chemical Formula 12 can be cured with high efficiency even at a relatively low temperature, and can provide a cured material having excellent mechanical properties and photosensitivity, thereby completing the present invention.

Specifically, the polyamide-imide resin has an imide bond in which at least 90% of the cyclization reaction has been completed, and contains a functional group including a carboxyl group or a hydroxyl group, and also includes a (meth)acryloyloxy group and an alkylene group having 1 to 20 carbon atoms, or a functional group including a (meth)acrylate group and an alkylene glycol group having 1 to 20 carbon atoms therein. Generally, it is known that if there is an imide bond, the solubility decreases and it is hardly soluble in most organic solvents. However, when a carboxyl group or a hydroxyl group is introduced into a polyamide-imide resin having a structure that is easily soluble in a polar solvent, photosensitivity can be realized through the introduction of a photopolymerizable group into a carboxy group or a hydroxyl group, or through the reaction of a carboxylic group or a hydroxyl group with a photoacid generator. In addition, unlike PAA or PAE precursor resins that require high curing temperatures of 300° C. or more in order to form an imide bond, high processing temperatures are not required. The temperature of the curing process for forming the cured product is characterized by being able to be applied at a low temperature of 250° C. or less.

The polyamide-imide includes a functional group containing a (meth)acryloyloxy group and an alkylene group having 1 to 20 carbon atoms or a functional group containing a (meth)acrylate group and an alkylene glycol group having 1 to 20 carbon atoms, and can have higher mechanical properties and elastic properties at the time of final curing.

The polyamide-imide resin has a weight average molecular weight of 3000 g/mol to 500,000 g/mol, 5000 g/mol to 300,000 g/mol, or 7000 g/mol to 150,000 g/mol, which is preferable for forming a cured film having excellent mechanical properties.

Chemical Formulas 11 and 12 are the same as those described above. However, more specific examples of Chemical Formulas 11 and 12 are as follows.

$Q_1$ and $Q_2$ may each include a divalent functional group represented by the following Chemical Formula 13.

[Chemical Formula 13]

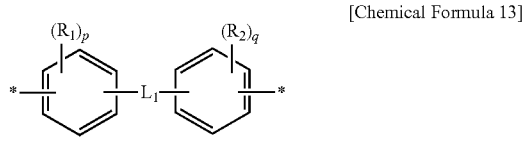

In Chemical Formula 13, $L_1$ is a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O—, or —OCO(CH$_2$)$_{n3}$OCO—, n1, n2, and n3 are each an integer of 1 to 10, $R_1$ and $R_2$ may be the same as or different from each, and are hydrogen, a halogen, an alkyl group having 1 to 10 carbon atoms, a hydroxyl group, or a carboxyl group, p and q are numbers in which $R_1$ and $R_2$ are substituted in an aromatic ring and are an integer of 1 to 4, at least one of $R_1$ and $R_2$ substituted in the aromatic ring is a hydroxyl group or a carboxyl group, and at least another of them is a functional group containing a (meth)acryloyloxy group and an alkylene group having 1 to 20 carbon atoms, or a functional group containing a (meth)acrylate group and an alkylene glycol group having 1 to 20 carbon atoms.

Specifically, the functional group containing a (meth)acryloyloxy group and an alkylene group having 1 to 20 carbon atoms or the functional group containing a (meth)acrylate group and an alkylene glycol group having 1 to 20 carbon atoms may be formed by reacting a hydroxyl group or a carboxyl group substituted in the aromatic ring with one of compounds represented by the following Chemical Formulas 14 to 16.

[Chemical Formula 14]

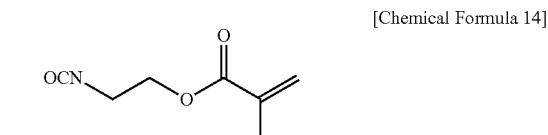

[Chemical Formula 15]

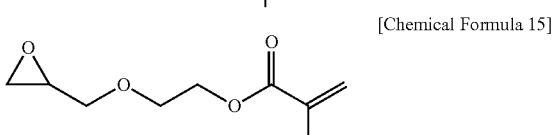

[Chemical Formula 16]

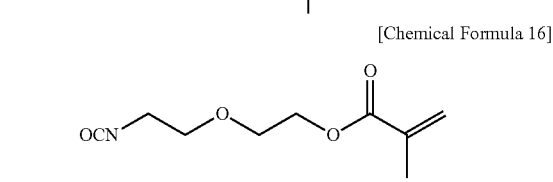

Here, X may include a tetravalent functional group of the following Chemical Formula 4.

[Chemical Formula 4]

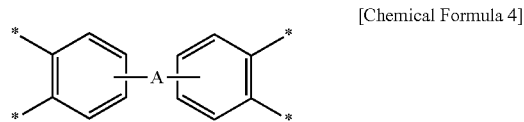

In Chemical Formula 4, A is a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are each an integer of 1 to 10.

The negative-type photosensitive resin composition may include a photoinitiator.

As the photoinitiator, a compound known to have a crosslinking reaction inducing effect in the technical field to which the present invention belongs can be applied without particular limitation.

As non-limiting examples, the photoinitiator may be compounds such as 1,3,4,6-tetrakis(methoxymethyl)tetrahydroimidazo[4,5-d]imidazole-2,5(1H,3H)-dione, 1,3,4,6-tetrakis(butoxymethyl)tetrahydroimidazo[4,5-d]imidazole-2,5(1H,3H)-dione), 2,6-bis(hydroxymethyl)benzene-1,4-diol, hexakis(methoxymethyl)-1,3,5-triazine-2,4,6-triamine, (propane-2,2-diylbis(2-hydroxybenzene-5,3,1-triyl))tetramethanol, 4,4'-(propane-2,2-diyl)bis(2,6-bis(methoxymethyl)phenol), 3,3',5,5'-tetrakis(hydroxymethyl)-[1,1'-biphenyl]-4,4'-diol, and 3,3',5,5'-tetrakis(methoxymethyl)-[1,1'-biphenyl]-4,4'-diol.

The photoinitiator may be included in an amount of 1 to 50 parts by weight, 5 to 40 parts by weight, or 10 to 30 parts by weight, based on 100 parts by weight of the polyamide-imide resin.

That is, in order to exhibit sufficient photo-initiating effects, the photoinitiator is preferably contained in an amount of 1 part by weight or more based on 100 parts by weight of the polyamide-imide resin. However, when an excess amount of the photoinitiator is applied to the photosensitive resin composition, the stability of the cured film may be lowered by the remaining photoinitiator. Therefore, it is preferable that the photoinitiator is contained in an amount of 50 parts by weight or less based on 100 parts by weight of the polyamide-imide resin.

Meanwhile, the negative-type photosensitive resin composition of the embodiment may include the photosensitive compound, and specific examples of the photosensitive compound may include a photo-curable polyfunctional acrylic compound.

The photocurable polyfunctional acrylic compound is a compound in which at least two acrylic structures capable of photocuring are present in the molecule, and specifically, it may include an acrylate-based compound, a polyester acrylate-based compound, a polyurethane acrylate-based compound, an epoxy acrylate-based compound, and a caprolactone-modified acrylate-based compound.

For example, the acrylate-based compound may include hydroxyl group-containing acrylate-based compounds such as pentaerythritol triacrylate and dipentaerythritol pentaacrylate, or water-soluble acrylate compounds such as polyethylene glycol diacrylate and polypropylene glycol diacrylate. The polyester acrylate-based compound may include trimethylolpropane triacrylate, pentaerythritol tetraacrylate, dipentaerythritol hexaacrylate, and the like. Further, the polyurethane acrylate-based compound may include an isocyanate-modified product of the above-mentioned hydroxyl group-containing acrylate-based compound. The epoxy acrylate-based compound may include bisphenol A diglycidyl ether, hydrogenated bisphenol A diglycidyl ether, a (meth)acrylic acid adduct of a phenol novolac epoxy resin, and the like. The caprolactone-modified acrylate-based compound may include a caprolactone-modified ditrimethylolpropane tetraacrylate, an epsiloncaprolactone-modified dipentaerythritol acrylate, a caprolactone-modified hydroxypivalic acid neopentyl glycol ester diacrylate, and the like.

The photocurable polyfunctional acrylic compound may be contained in an amount of 1 to 50 parts by weight, 5 to 40 parts by weight, or 10 to 30 parts by weight, based on 100 parts by weight of the polyamide-imide resin.

That is, in order to exhibit sufficient crosslinking effects, the photocurable polyfunctional acrylic compound is preferably contained in an amount of 1 part by weight or more based on 100 parts by weight of the polyamide-imide resin. However, when an excess amount of the photocurable polyfunctional acrylic compound is applied to the photosensitive resin composition, the low temperature curability and the photosensitivity due to the polyamide-imide resin may be lowered. Therefore, it is preferable that the photocurable polyfunctional acrylic compound is contained in an amount of 50 parts by weight or less based on 100 parts by weight of the polyamide-imide resin.

Meanwhile, the positive-type photosensitive resin composition and the negative-type photosensitive resin composition of the above-mentioned embodiments may selectively include an epoxy resin, respectively.

The epoxy resin may serve to exhibit a high adhesion and adhesive property of a substrate used for a semiconductor device or a display device.

Such epoxy resins may include, for example, one or more selected from the group consisting of a bisphenol A type of epoxy resin, a hydrogenated bisphenol A type of epoxy resin, a brominated bisphenol A type of epoxy resin, a bisphenol F type of epoxy resin, a bisphenol S type of epoxy resin, a novolac type of epoxy resin, a phenol novolac type of epoxy resin, a cresol novolac type of epoxy resin, an N-glycidyl type of epoxy resin, a bisphenol A type of novolac epoxy resin, a bixylenol type of epoxy resin, a biphenol type of epoxy resin, a chelate type of epoxy resin, a glyoxal of type epoxy resin, an amino group-containing epoxy resin, a rubber-modified epoxy resin, a dicyclopentadiene phenolic epoxy resin, a diglycidyl phthalate resin, a heterocyclic epoxy resin, a tetraglycidyl xylenoyl ethane resin, a silicone-modified epoxy resin, and an epsilon-caprolactone-modified epoxy resin. Preferably, it may include a liquid type of N-glycidyl epoxy resin.

The epoxy resin may be included in an amount of 5 to 100 parts by weight, 10 to 100 parts by weight, or 10 to 75 parts by weight, based on 100 parts by weight of the polyamide-imide resin.

When the epoxy resin is used, a thermal acid generator can be used. Examples of the thermal acid generator are not particularly limited, and a compound commonly known to be usable as a thermal acid generator may be used.

Meanwhile, the positive-type photosensitive resin composition and the negative-type photosensitive resin composition of the above embodiments may selectively further include at least one curing accelerator selected from the group consisting of an imidazole-based compound, a phosphine-based compound, and a tertiary amine compound, respectively.

The imidazole-based compound may be, for example, 2-phenylimidazole, 2-phenyl-4-methylimidazole, or 2-phenyl-4-methyl-5-hydroxymethylimidazole. The phosphine-based compound may be, for example, triphenylphosphine, diphenylphosphine, phenylphosphine, or tetraphenylphosphonium tetraphenylborate. The tertiary amine compound may be, for example, dicyandiamide, benzyldimethylamine, 4-(dimethylamino)-N,N-dimethylbenzylamine, 4-methoxy-N,N-dimethylbenzylamine, or 4-methyl-N,N-dimethylbenzylamine.

Such a curing accelerator may be included in an amount of 0.1 to 10 parts by weight based on 100 parts by weight of the polyamide-imide resin.

Meanwhile, the positive-type photosensitive resin composition and the negative-type photosensitive resin composition of the above-mentioned embodiments may selectively further include additives such as a surfactant, a coupling agent, a filler, an antioxidant, an ultraviolet absorber, an aggregation prevention agent, a corrosion inhibitor, an anti-foaming agent, an anti-gelling agent, and the like, if necessary, within a range which does not impair the above-described effects.

For example, as the adhesion promoting agent, a silane coupling agent having a functional group such as epoxy, a carboxyl group, or isocyanate may be used, and specific examples thereof include trimethoxysilyl benzoic acid, triethoxysilyl benzoic acid, gamma-isocyanatopropyltrimethoxysilane, gamma-isocyanatopropyltriethoxysilane, gamma-glycidoxypropyltrimethoxysilane, gamma-glycidoxypropyltriethoxysilane, or mixtures thereof. Such an adhesion promoting agent may be included in an amount of 0.1 to 10 parts by weight based on 100 parts by weight of the polyamide-imide resin.

The surfactant may be used without limitation as long as it is known to be usable in the photosensitive resin composition, but it is preferable to use a fluorine-based surfactant or a silicon-based surfactant. Such surfactant may be included in an amount of 0.1 to 5 parts by weight based on 100 parts by weight of the polyamide-imide resin.

According to another embodiment of the present invention, a cured film including a cured product of the photosensitive resin composition is provided.

As the photosensitive resin composition includes the polyamide-imide resin, it can be cured with high efficiency even at a temperature of 250° C. or less, 200° C. or less, or 150° C. to 250° C., and enables provision of a cured film having excellent mechanical properties even under such curing conditions.

In particular, the cured film exhibits excellent heat resistance and insulating properties, and thus can be preferably applied to an insulating film of a semiconductor device, an interlayer insulating film of a rewiring film, and the like. In addition, the cured film can be applied to a photoresist, an etching resist, a solder top resist, or the like.

Further, according to another embodiment of the present invention, a method for preparing a cured film a step of curing the photosensitive resin composition at a temperature of 250° C. or less can be provided.

As described above, the photosensitive resin composition can be cured with high efficiency even at a temperature of 250° C. or less, 200° C. or less, or 150° C. to 250° C.

More specifically, the cured film is formed through the steps of applying the photosensitive resin composition onto a substrate, irradiating the photosensitive resin composition applied onto a substrate with actinic rays or radiation and exposing it, subjecting the exposed photosensitive resin composition to development treatment, and heating the developed photosensitive resin composition.

Examples of the method for applying a photosensitive resin composition onto a substrate include spinning, immersing, doctor-blade coating, suspended casting, painting, spraying, electrostatic spraying, and reverse-roll coating. At this time, the amount of the photosensitive resin composition to be applied and the type of the substrate are dependent on the use of the cured film and the field of applications. It is preferable that the photosensitive resin composition is applied onto a substrate and then dried under appropriate conditions.

In the step of exposing, the photosensitive resin composition applied onto a substrate is irradiated with actinic rays or radiation in a predetermined pattern. Actinic rays or radiation having a wavelength of 200 nm to 600 nm may be applied in the step of exposing. As exposure equipment, various types of exposure equipment such as a mirror projection aligner, a scanner, a stepper, proximity, contact, a microlens array, a laser exposer, and a lens scanner may be used.

In the step of carrying out development treatment, an unexposed portion of the photosensitive resin composition is developed using a developing solution. An aqueous alkaline developing solution, an organic solvent, or the like may be used as the developing solution.

According to another embodiment of the present invention, a method for forming a resist pattern can be provided, including the steps of: forming a resist film on a substrate using the above photosensitive resin composition; irradiating the resist film in a pattern using a high energy ray; and developing the resist film using an alkali developing solution.

In the method for forming a resist pattern of this embodiment, a conventionally known method for producing a cured film and a method and apparatus for forming a resist pattern can be used without particular limitation.

Advantageous Effects

According to the present invention, a photosensitive resin composition which can be cured with high efficiency even at a relatively low temperature and can provide a cured material having excellent mechanical properties and photosensitivity, a cured film formed from the photosensitive resin composition, and a method for preparing a cured film capable of providing a cured material having excellent mechanical properties and photosensitivity by curing the photosensitive resin composition at a relatively low temperature, can be provided.

DETAILED DESCRIPTION OF THE EMBODIMENTS

The present invention will be described in more detail by way of the following examples. However, the following examples are provided only to illustrate the invention, and the scope of the invention is not limited by the following examples.

PREPARATION EXAMPLES

Preparation Example 1: Synthesis of Polyamide-Imide Resin (A1)

5 g (0.0156 mol) of 2,2'-bis(trifluoromethyl)benzidine; 1.904 g (0.0052 mol) of 2,2'-bis(3-amino-4-hydroxyphenyl) hexafluoropropane; 3.226 g (0.0104 mol) of 4,4'-oxydiphthalic anhydride; 2.111 g (0.0104 mol) of isophthaloyl dichloride; and 30 g of N,N-dimethylacetamide were added to a 250 mL round flask equipped with a Dean-Stark apparatus and a condenser, and the mixture was stirred in a nitrogen atmosphere for 3 hours to carry out a polymerization reaction.

2.34 g of acetic anhydride and 0.32 g of pyridine were added to the polyamic acid solution obtained by the polymerization reaction, and the mixture was stirred in an oil bath at 60° C. for 18 hours to carry out a chemical imidization reaction.

After completion of the reaction, the solid content was precipitated with water and ethanol, and the precipitated solids were filtered and then dried under vacuum at 40° C. for 24 hours or more to obtain a polyamide-imide block copolymer having the following repeating units (weight average molecular weight: 120,000 g/mol).

Preparation Examples 2 to 4: Synthesis of Polyamide-Imide Resin (A2 to A4)

A polyamide-imide block copolymer was obtained in the same manner as in Preparation Example 1, except that the proportions of the monomers used were changed as shown in Table 1 below.

Preparation Examples 5 to 8: Synthesis of Polyamide-Imide Resin (B1 to B4)

A photo-curable group was introduced into the polyamide-imide resin obtained in Preparation Examples 1 to 4. Specifically, 4 g of the polyamide-imide resin of A1 to A4 was added to 16 g of N,N-dimethylacetamide in a 250 ml round flask, and the mixture was stirred to completely dissolve it. Then, 0.4 g (0.0026 mol) of 2-isocyanatoethyl methacrylate was added to the reaction solution and stirred at 50° C. for 4 hours to obtain a polyamide-imide resin of B1 to B4.

Comparative Preparation Example 1: Synthesis of Polyimide Resin (C1)

7.618 g (0.0208 mol) of 2,2'-bis(3-amino-4-hydroxyphenyl)hexafluoropropane; 9.24 g (0.0208 mol) of 4,4'-(hexafluoropropylidene)diphthalic anhydride; 0.131 g (0.0008 mol) of nadic anhydride, and 40 g of N,N-dimethylacetamide were added to a 250 mL round flask equipped with a Dean-Stark apparatus and a condenser, and the mixture was stirred in a nitrogen atmosphere for 4 hours to carry out a polymerization reaction.

2.34 g of acetic anhydride and 0.32 g of pyridine were added to the polyamic acid solution obtained by the polymerization reaction, and the mixture was stirred in an oil bath at 60° C. for 18 hours to carry out a chemical imidization reaction.

After completion of the reaction, the solid content was precipitated with water and ethanol, and the precipitated solids were filtered and then dried under vacuum at 40° C. for 24 hours or more to obtain a polyimide resin having the following repeating units (weight average molecular weight: 55,000 g/mol).

Comparative Preparation Example 2: Synthesis of Polyimide Resin (C2)

A polyimide resin was obtained in the same manner as in Preparation Example 5 by using the polyimide resin obtained in Comparative Preparation Example 1.

Comparative Preparation Example 3: Synthesis of Polyamide-Imide Resin (C3)

A polyamide-imide resin was obtained in the same manner as in Preparation Example 1, except that the proportions of the monomers used were changed as shown in Table 1 below.

Comparative Preparation Example 4: Synthesis of Polyamide-Imide Resin (C4)

A polyamide-imide resin was obtained in the same manner as in Preparation Example 5 by using the polyamide-imide resin obtained in Comparative Preparation Example 3.

N-methyl-2-pyrrolidone (NMP) were added, and the mixture was stirred at room temperature for 4 hours and then filtered through a filter having a pore size of 5 µm to prepare a photosensitive resin composition.

Comparative Examples 1 and 2: Preparation of Positive-Type Photosensitive Resin Composition To 3 g of each of the polyimide resin synthesized in Comparative Preparation Example 1 and the polyamide-imide resin synthesized in Comparative Preparation Example 3, 0.3 g of a diazonaphthoquinone ester compound (TPD 520) and 4.5 g of a solvent N-methyl-2-pyrrolidone (NMP) were added, and the mixture was stirred at room

TABLE 1

| Preparation Example | Resin | Amine component ① | Amine component ② | Acid dianhydride ① | Acid dianhydride ② | End sealing material | Photo-polymerizable group |
|---|---|---|---|---|---|---|---|
| 1 | A1 | TFMB (0.0156 mol) | BisAPAF (0.0052 mol) | ODPA (0.0104 mol) | IPDC (0.0104 mol) | — | — |
| 2 | A2 | TFMB (0.0104 mol) | BisAPAF (0.0104 mol) | ODPA (0.0104 mol) | IPDC (0.0104 mol) | — | — |
| 3 | A3 | TFMB (0.0156 mol) | HAB (0.0052 mol) | ODPA (0.0104 mol) | IPDC (0.0104 mol) | — | — |
| 4 | A4 | TFMB (0.0104 mol) | HAB (0.0104 mol) | ODPA (0.0104 mol) | IPDC (0.0104 mol) | — | — |
| 5 | B1 | TFMB (0.0156 mol) | BisAPAF (0.0052 mol) | ODPA (0.0104 mol) | IPDC (0.0104 mol) | — | MOI (0.0021 mol) |
| 6 | B2 | TFMB (0.0104 mol) | BisAPAF (0.0104 mol) | ODPA (0.0104 mol) | IPDC (0.0104 mol) | — | MOI (0.0021 mol) |
| 7 | B3 | TFMB (0.0156 mol) | HAB (0.0052 mol) | ODPA (0.0104 mol) | IPDC (0.0104 mol) | — | MOI (0.0021 mol) |
| 8 | B4 | TFMB (0.0104 mol) | HAB (0.0104 mol) | ODPA (0.0104 mol) | IPDC (0.0104 mol) | — | MOI (0.0021 mol) |
| Comparative Preparation Example 1 | C1 | — | BisAPAF (0.0208 mol) | 6FDA (0.0208 mol) | — | NDA (0.0008 mol) | — |
| Comparative Preparation Example 2 | C2 | — | BisAPAF (0.0208 mol) | 6FDA (0.0208 mol) | — | NDA (0.0008 mol) | MOI (0.0021 mol) |
| Comparative Preparation Example 3 | C3 | TFMB (0.02068) | — | ODPA (0.0104 mol) | IPDC (0.0104 mol) | — | — |
| Comparative Preparation Example 4 | C4 | TFMB (0.02068) | — | ODPA (0.0104 mol) | IPDC (0.0104 mol) | — | MOI (0.0021 mol) |

TFMB: 2,2'-bis(trifluoromethyl)benzidine
BisAPAF: 2,2'-bis(3-amino-4-hydroxyphenyl)hexafluoropropane
HAB: 3,3'-dihydroxy-4,4'-diaminobiphenyl
ODPA: 4,4'-oxydiphthalic anhydride
IPDC: isophthaloyl dichloride
MOI: Karenz MOI ™
NDA: Nadic anhydride Examples 1 to 4: Preparation of Positive-Type Photosensitive Resin Composition To 3 g of each polyamide-imide resin synthesized in Preparation Examples 1 to 4, 0.3 g of diazonaphthoquinone ester compound (TPD 520) and 4.5 g of solvent N-methyl-2-pyrrolidone (NMP) were added, and the mixture was stirred at room temperature for 4 hours and then filtered through a filter having a pore size of 5 µm to prepare a photosensitive resin composition.

Examples 5 to 8: Preparation of Positive-Type Photosensitive Resin Composition

To 3 g of each polyamide-imide resin synthesized in Preparation Examples 1 to 4, 0.6 g of a diazonaphthoquinone ester compound (TPD 520) and 4.5 g of a solvent temperature for 4 hours and then filtered through a filter having a pore size of 5 µm to prepare a photosensitive resin composition.

Comparative Examples 3 and 4: Preparation of Positive-Type Photosensitive Resin Composition To 3 g of each of the polyimide resin synthesized in Comparative Preparation Example 1 and the polyamide-imide resin synthesized in Comparative Preparation Example 3, 0.6 g of a diazonaphthoquinone ester compound (TPD 520) and 4.5 g of a solvent N-methyl-2-pyrrolidone (NMP) were added, and the mixture was stirred at room temperature for 4 hours and then filtered through a filter having a pore size of 5 µm to prepare a photosensitive resin composition.

Examples 9 to 12: Preparation of Negative-Type Photosensitive Resin Composition To 3 g of each polyamide-imide resin synthesized in Preparation Examples 5 to 8, 0.03 g of an oxime ester-based photo-polymerization initiator OXE-01, 0.45 g of polyethylene glycol di(meth)acrylate, 0.3 g of propylene glycol diglycidyl ether, and 4.5 g of a solvent N-methyl-2-pyrrolidone (NMP) were added, and the mixture was stirred at room temperature for 4 hours, and then filtered through a filter having a pore size of 5 µm to prepare a photosensitive resin composition.

Examples 13 to 16: Preparation of Negative-Type Photosensitive Resin Composition To 3 g of each polyamide-imide resin synthesized in Preparation Examples 5 to 8, 0.03 g of an oxime ester-based photo-polymerization initiator OXE-01, 0.9 g of polyethylene glycol di(meth)acrylate, 0.3 g of propylene glycol diglycidyl ether, and 4.5 g of a solvent N-methyl-2-pyrrolidone (NMP) were added, and the mixture was stirred at room temperature for 4 hours, and then filtered through a filter having a pore size of 5 µm to prepare a photosensitive resin composition.

Comparative Examples 5 to 6: Preparation of Negative-Type Photosensitive Resin Composition To 3 g of each of the polyimide resin synthesized in Comparative Preparation Example 2 and the polyamide-imide resin synthesized in Comparative Preparation Example 4, 0.03 g of an oxime ester-based photo-polymerization initiator OXE-01, 0.45 g of polyethylene glycol di(meth)acrylate, 0.3 g of propylene glycol diglycidyl ether, and 4.5 g of a solvent N-methyl-2-pyrrolidone (NMP) were added, and the mixture was stirred at room temperature for 4 hours, and then filtered through a filter having a pore size of 5 µm to prepare a photosensitive resin composition.

Comparative Examples 7 and 8: Preparation of Negative-Type Photosensitive Resin Composition To 3 g of each of the polyimide resin synthesized in Comparative Preparation Example 2 and the polyamide-imide resin synthesized in Comparative Preparation Example 4, 0.03 g of an oxime ester-based photo-polymerization initiator OXE-01, 0.9 g of polyethylene glycol di(meth)acrylate, 0.3 g of propylene glycol diglycidyl ether, and 4.5 g of a solvent N-methyl-2-pyrrolidone (NMP) were added, and the mixture was stirred at room temperature for 4 hours, and then filtered through a filter having a pore size of 5 µm to prepare a photosensitive resin composition.

Test Example 1: Evaluation Method of Sensitivity

The photosensitive resin composition prepared in the Examples and Comparative Examples was spin-coated onto a 4-inch silicon wafer, and then heated on a hot plate at 120° C. for 2 minutes, thereby forming a photosensitive resin film having a thickness of 15 µm. The silicon wafer in which the photosensitive resin film was formed was sequentially exposed with an i-line stepper (Nikon NSR 1505 i5A) up to 990 mJ/cm$^2$ at an interval from 30 mJ/cm$^2$ to 40 mJ/cm$^2$. After developing in a 2.38 wt % tetramethylammonium aqueous solution (NEPES, CPD-18) at 23° C. for 90 seconds, it was washed with ultrapure water for 60 seconds and dried in air.

At this time, in the case of the positive composition, the amount of exposure (also referred to as the minimum amount of exposure Eth) in which the exposed portion was not completely eluted and lost was taken as sensitivity.

On the other hand, in the case of the negative composition, the amount of exposure in which the unexposed portion was completely eluted and lost was taken as sensitivity. The results are shown in Tables 2 and 3 below.

Test Example 2: Measurement Method of Alkali Development Speed

The photosensitive resin compositions prepared in the examples and comparative examples were spin-coated onto a 4 inch silicon wafer, and then heated on a hot plate at 120° C. for 2 minutes, thereby forming a photosensitive resin film having a thickness of 15 µm. The number of revolutions of the spin coating was adjusted so that the thickness of the resin film became 15 µm. The resin film was developed in a 2.38 wt % tetramethylammonium aqueous solution (NEPES, CPD-18) at 23° C. for 1 minute, then washed with ultrapure water for 60 seconds and dried in air. The film thickness after drying was measured, and the decrease in film thickness per minute was calculated. These results are shown in Tables 2 and 3 below.

Test Example 3: Measurement Method of Physical Properties of Resin Cured Film The photosensitive resin compositions prepared in the examples and comparative examples were spin-coated onto a 4 inch silicon wafer, and then heated on a hot plate at 120° C. for 2 minutes, thereby forming a photosensitive resin film having a thickness of 15 µm. The number of revolutions of the spin coating was adjusted so that the thickness of the resin film became 15 µm. The silicon wafer coated with the resin film was heated at a temperature from 25° C. to 200° C. for 1 hour in a nitrogen atmosphere, and then the temperature was maintained at 200° C. for 1 hour to obtain a cured film. Then, the cured film was peeled off using a hydrofluoric acid aqueous solution, washed with water, and dried. The peeled film was cut to a size of 1 cm in width and 8 cm in length, and then tensile properties were measured. The results are shown in Tables 2 and 3 below.

TABLE 2

| | Sensitivity (mJ/cm$^2$) | Alkali development speed (nm/min) | Tensile strength (MPa) | Modulus (GPa) | Elongation rate (%) |
|---|---|---|---|---|---|
| Example 1 | 470 | 4000 | 125 | 3.4 | 11.2 |
| Example 2 | 430 | 6000 | 133 | 3.4 | 15.8 |
| Example 3 | 630 | 1800 | 137 | 3.6 | 28.5 |
| Example 4 | 590 | 2300 | 135 | 3.6 | 22.3 |
| Example 5 | 430 | 4700 | 127 | 3.3 | 14.7 |
| Example 6 | 390 | 7200 | 131 | 3.5 | 17.1 |
| Example 7 | 590 | 2000 | 143 | 3.7 | 27.4 |
| Example 8 | 510 | 2500 | 148 | 3.7 | 25.3 |
| Comparative Example 1 | 270 | >50000 | 122 | 3.2 | 3.8 |
| Comparative Example 2 | 870 | 200 | 143 | 3.7 | 29.8 |
| Comparative Example 3 | 190 | >50000 | 130 | 3.3 | 6.1 |

TABLE 2-continued

| | Sensitivity (mJ/cm²) | Alkali development speed (nm/min) | Tensile strength (MPa) | Modulus (GPa) | Elongation rate (%) |
|---|---|---|---|---|---|
| Comparative Example 4 | 830 | 200 | 141 | 3.8 | 32.1 |

TABLE 3

| | Sensitivity (mJ/cm²) | Alkali development speed (nm/min) | Tensile strength (MPa) | Modulus (GPa) | Elongation rate (%) |
|---|---|---|---|---|---|
| Example 9 | 630 | 3500 | 126 | 3.4 | 13.5 |
| Example 10 | 710 | 4700 | 129 | 3.4 | 18.2 |
| Example 11 | 830 | 1500 | 127 | 3.6 | 28.1 |
| Example 12 | 790 | 2000 | 135 | 3.6 | 23.8 |
| Example 13 | 550 | 3300 | 129 | 3.3 | 13.7 |
| Example 14 | 670 | 4200 | 125 | 3.5 | 18.0 |
| Example 15 | 790 | 1900 | 140 | 3.7 | 25.1 |
| Example 16 | 790 | 1500 | 139 | 3.7 | 26.6 |
| Comparative Example 5 | 230 | 15000 | 128 | 3.2 | 4.7 |
| Comparative Example 6 | 870 | 100 | 141 | 3.7 | 30.5 |
| Comparative Example 7 | 150 | 17000 | 133 | 3.3 | 6.8 |
| Comparative Example 8 | 910 | 100 | 147 | 3.8 | 29.7 |

(Compound used)

Diazonaphthoquinone compound: TPD 520/Miwon Specialty Chemical Co., Ltd.

Photo-initiator compound: OXE-01/BASF

Photo-curable acrylic compound: polyethylene glycol di(meth)acrylate/Sigma-Aldrich Curing agent: propylene glycol diglycidyl ether (trade name, Epolight-70P)/Kyoeisha Chemical Co., Ltd.

Solvent: N-methyl-2-pyrrolidone/Sigma-Aldrich

As shown in Tables 2 and 3, it was confirmed that when the compositions of the examples were used, high sensitivity and alkali development speed could be achieved together, and a high elongation rate could be secured while maintaining the tensile strength and modulus of the finally obtained cured film at a high level.

The invention claimed is:

1. A negative-type photosensitive resin composition comprising a polyamide-imide resin containing a repeating unit represented by Chemical Formula 11 and a repeating unit represented by Chemical Formula 12, and a photoacid generator:

[Chemical Formula 11]

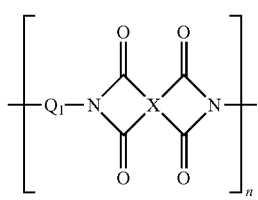

[Chemical Formula 12]

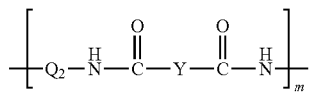

wherein, in the Chemical Formulae 11 and 12,

X is an aliphatic, alicyclic, or aromatic tetravalent organic group or a tetravalent organic group containing at least one heteroatom selected from the group consisting of N, O, and S, Y is an aliphatic, alicyclic, or aromatic divalent organic group, or a divalent organic group containing at least one heteroatom selected from the group consisting of N, O, and S, and n and m are each an integer of 1 or more, wherein $Q_1$ and $Q_2$ each include a divalent functional group represented by Chemical Formula 13,

[Chemical Formula 13]

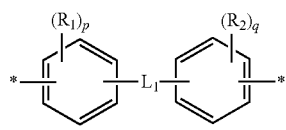

wherein, in the Chemical Formula 13, $L_1$ is a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O—, or —OCO(CH$_2$)$_{n3}$OCO—, n1, n2, and n3 are each an integer of 1 to 10, $R_1$ and $R_2$ are the same as or different from each other, and are hydrogen, a halogen, an alkyl group having 1 to 10 carbon atoms, a hydroxyl group, or a carboxyl group, p and q are an integer of 1 to 4, at least one of $R_1$ and $R_2$ is a hydroxyl group or a carboxyl group, and the remaining thereof is a functional group comprising a structure formed from a reaction of a hydroxyl group or a carboxyl group substituted in the aromatic ring with one of compounds represented by Chemical Formulae 15 to 16,

[Chemical Formula 15]

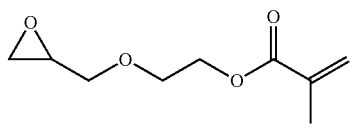

[Chemical Formula 16]

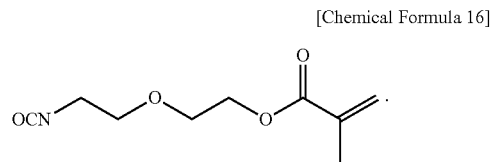

2. The negative-type photosensitive resin composition according to claim 1, wherein X includes a tetravalent functional group of the following Chemical Formula 4:

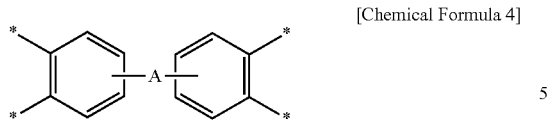

[Chemical Formula 4]

wherein, in Chemical Formula 4, A is a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are each an integer of 1 to 10.

3. The negative-type photosensitive resin composition according to claim 1, further comprising a photo-curable polyfunctional acrylic compound.

4. A film comprising a cured product of the photosensitive resin composition of claim 1.

5. A method for preparing a film comprising a step of curing the photosensitive resin composition of claim 1 at a temperature of 250° C. or less.

6. A method for forming a resist pattern comprising the steps of:
   forming a resist film on a substrate using the photosensitive resin composition of claim 1;
   irradiating the resist film in a pattern using a high energy ray, and
developing the resist film using an alkali developing solution.

\* \* \* \* \*